(12) United States Patent
Jang

(10) Patent No.: US 9,910,068 B2
(45) Date of Patent: Mar. 6, 2018

(54) SEMICONDUCTOR CHIP TEST DEVICE

(71) Applicant: NTS CO., LTD., Cheonan-si, Chungcheongnam-do (KR)

(72) Inventor: Tae Young Jang, Incheon (KR)

(73) Assignee: NTS CO., LTD., Cheonan-si, Chungcheongnam-do (KR)

(*) Notice: Subject to any disclaimer, the term of this patent is extended or adjusted under 35 U.S.C. 154(b) by 121 days.

(21) Appl. No.: 15/024,346

(22) PCT Filed: Sep. 11, 2014

(86) PCT No.: PCT/KR2014/008491
§ 371 (c)(1),
(2) Date: Mar. 23, 2016

(87) PCT Pub. No.: WO2015/046786
PCT Pub. Date: Apr. 2, 2015

(65) Prior Publication Data
US 2016/0231355 A1 Aug. 11, 2016

(30) Foreign Application Priority Data
Sep. 30, 2013 (KR) .................. 10-2013-0116044

(51) Int. Cl.
*G01R 1/04* (2006.01)
*G01R 31/28* (2006.01)

(52) U.S. Cl.
CPC ....... *G01R 1/0466* (2013.01); *G01R 31/2863* (2013.01)

(58) Field of Classification Search
CPC .............. G01R 1/0441; G01R 31/2863; G01R 1/0408; G01R 1/0433; G01R 1/0483;
(Continued)

(56) References Cited

U.S. PATENT DOCUMENTS 6,359,452 B1 * 3/2002 Mozzetta ............. G01R 1/0408
324/750.25
2007/0170939 A1 * 7/2007 Park .................. G01R 31/2886
324/750.01
(Continued)

FOREIGN PATENT DOCUMENTS

JP 2000-340326 A 12/2000
JP 2007-163463 A 6/2007
(Continued)

OTHER PUBLICATIONS

Japanese Office Action dated Dec. 6, 2016 in connection with the counterpart Patent Application No. 2016-545672.
(Continued)

Primary Examiner — Tung X Nguyen
Assistant Examiner — Robert P Alejnikov, Jr.
(74) Attorney, Agent, or Firm — Hauptman Ham, LLP

(57) ABSTRACT

A semiconductor chip test device may include: a guide plate having a seating groove formed at the bottom thereof; a substrate coupled to the bottom of the guide plate, and having an upper semiconductor chip mounted on the top surface thereof such that the upper semiconductor chip is positioned in the seating groove; an upper socket having upper pogo pins coupled to the bottom of the guide plate in a state where the upper pogo pins are in contact with bottom patterns of the substrate, and having lower pogo pins formed on the bottom surface thereof, wherein the upper pogo pins protrude upward, and the lower pogo pins protrude downward; and a lower socket having a lower semiconductor chip seated on the top surface thereof, the lower semiconductor chip being in contact with the lower pogo pins.

7 Claims, 4 Drawing Sheets

(58) Field of Classification Search
CPC ............... G01R 1/07314; G01R 31/26; G01R 31/2808; G01R 31/2886; G01R 1/0466; G01R 31/2879; G01R 31/2889; G01R 31/2896
USPC ........................................ 324/756.02, 756.01
See application file for complete search history.

(56) References Cited

U.S. PATENT DOCUMENTS

| | | | | |
|---|---|---|---|---|
| 2009/0015279 A1* | 1/2009 | Cho | ..................... | G01R 1/0483 324/756.02 |
| 2009/0130785 A1* | 5/2009 | Matsumoto | .......... | G01R 1/0735 438/17 |
| 2010/0295572 A1* | 11/2010 | Ryu | ..................... | G01R 1/0483 324/765.01 |

FOREIGN PATENT DOCUMENTS

| | | | |
|---|---|---|---|
| JP | 2008026108 A | 2/2008 | |
| JP | 2009-020105 A | 1/2009 | |
| KR | 20000006117 A | 1/2000 | |
| KR | 20020093380 A | 12/2002 | |
| KR | 20100040258 A | 4/2010 | |
| KR | 20130071038 A | 6/2013 | |
| WO | 2006/097973 A1 | 9/2006 | |

OTHER PUBLICATIONS

International Search Report dated Dec. 18, 2014 corresponding to International Application No. PCT/KR2014/008491.

* cited by examiner

SEMICONDUCTOR CHIP TEST DEVICE

TECHNICAL FIELD

The present disclosure relates to a semiconductor chip test device, and more particularly, to a semiconductor chip test device which is used in a test process for determining whether a semiconductor chip has a defect.

BACKGROUND ART

In general, a semiconductor chip used when an electronic device is manufactured is passed through a test process for determining whether the semiconductor chip has a defect. Such a test process can secure the electrical characteristic and reliability of the semiconductor chip.

A semiconductor chip test device used for such a test includes a plate for installing a semiconductor chip, a socket connected to terminals of the semiconductor chip at one surface of the plate through pins, and a pressurizing unit which elastically supports the semiconductor chip toward the socket.

According to the semiconductor chip test device, the pressurizing unit elastically supports the semiconductor chip to be fixed at a predetermined position, and the socket exchanges electrical signals with the semiconductor chip.

The related art of the present invention is disclosed in Korean Patent Laid-open Publication No. 10-2013-0071038 published on Jun. 28, 2013 and titled "Socket for testing semiconductor chip".

DISCLOSURE

Technical Problem

Various embodiments are directed to a semiconductor chip test device capable of stably maintaining the test yield of semiconductor chips.

Technical Solution

In an embodiment, a semiconductor chip test device may include: a guide plate having a seating groove formed at the bottom thereof; a substrate coupled to the bottom of the guide plate, and having an upper semiconductor chip mounted on the top surface thereof such that the upper semiconductor chip is positioned in the seating groove; an upper socket having upper pogo pins coupled to the bottom of the guide plate in a state where the upper pogo pins are in contact with bottom patterns of the substrate, and having lower pogo pins formed on the bottom surface thereof, wherein the upper pogo pins protrude upward, and the lower pogo pins protrude downward; and a lower socket having a lower semiconductor chip seated on the top surface thereof, the lower semiconductor chip being in contact with the lower pogo pins.

The guide plate may have an opening/closing groove formed at the top thereof, the opening/closing groove communicating with the seating groove while being formed through the guide plate in the vertical direction, and a pressurizing member may be installed in the opening/closing groove so as to elastically support the upper semiconductor chip positioned in the seating groove downward.

The pressurizing member may include: a cover coupled to the opening/closing groove; and a pressurizing part positioned between the cover and the upper semiconductor chip, and electrically supporting the upper semiconductor chip downward.

The pressurizing part may include: a pressurizing plate installed between the cover and the upper semiconductor chip so as to be lifted and lowered, and pressurizing the upper semiconductor chip downward; and an elastic member installed between the cover and the pressurizing plate and providing an elastic force of pressurizing the pressurizing plate downward.

The pressurizing plate may include a plurality of installation grooves formed at the center position thereof, which forms the same line as the center of the upper semiconductor chip, and at the edge part around the center position thereof, the installation grooves being formed at even intervals along the edge part.

The semiconductor chip test device may further include a fastening member coupling the upper socket and the substrate to the bottom of the guide plate through edge parts of the upper socket and the substrate.

The upper pogo pins and the lower pogo pins may be arranged in a plurality of lines along the top and bottom edges of the upper socket.

The upper socket may have a plurality of arrangement pins formed at the bottom edge thereof so as to protrude downward, and the lower socket may have a plurality of concave insertion grooves formed on the top surface thereof, such that the arrangement pins are inserted into the insertion grooves.

Advantageous Effects

According to the embodiment of the present invention, the semiconductor chip test device can suppress the occurrence of connection defect between the upper semiconductor chip and the upper socket, and absorb an impact which may occur during a performance test of the semiconductor chip, thereby preventing the damage of the device and the semiconductor chip. Thus, the test yield of the semiconductor chip can be stably maintained.

MODE FOR INVENTION

Hereafter, a semiconductor chip test device according to an embodiment of the present invention will be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 1:
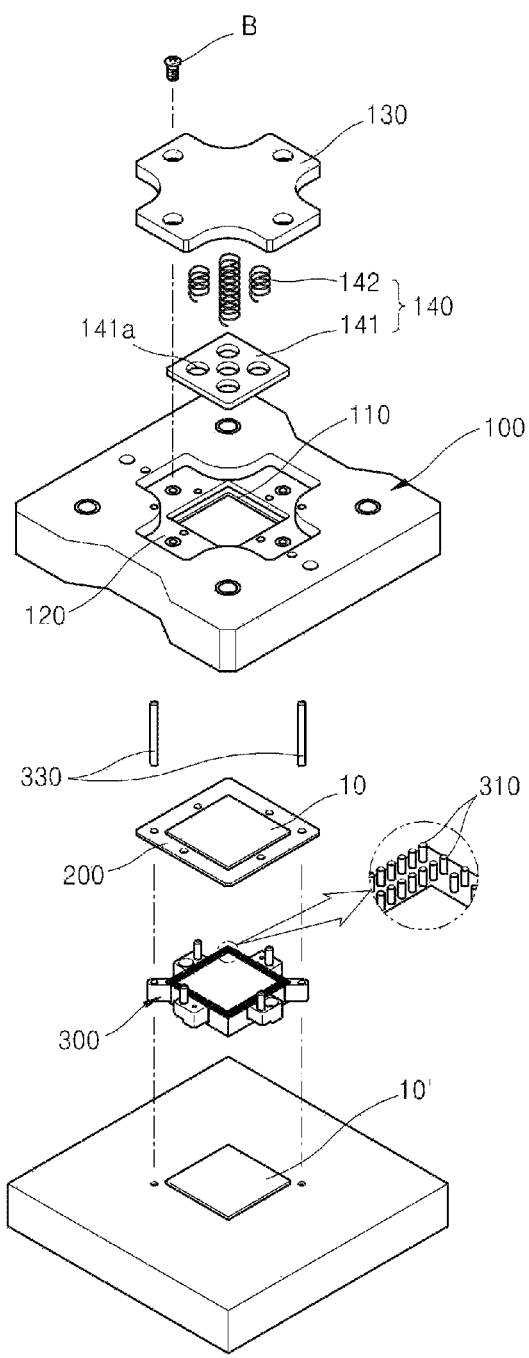
FIG. 1 is an exploded perspective view illustrating a state in which components of a semiconductor chip test device according to an embodiment of the present invention are separated.
Figure 2:
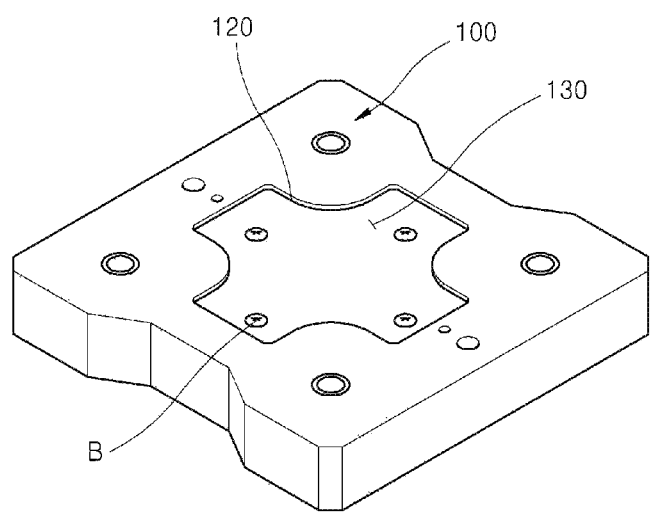
FIG. 2 is an assembled perspective view illustrating a state in which the components of the semiconductor chip test device according to the embodiment of the present invention are assembled.

FIG. 1 is an exploded perspective view illustrating a state in which components of a semiconductor chip test device according to an embodiment of the present invention are separated, and FIG. 2 is an assembled perspective view illustrating a state in which the components of the semiconductor chip test device according to the embodiment of the present invention are assembled.

Figure 3:
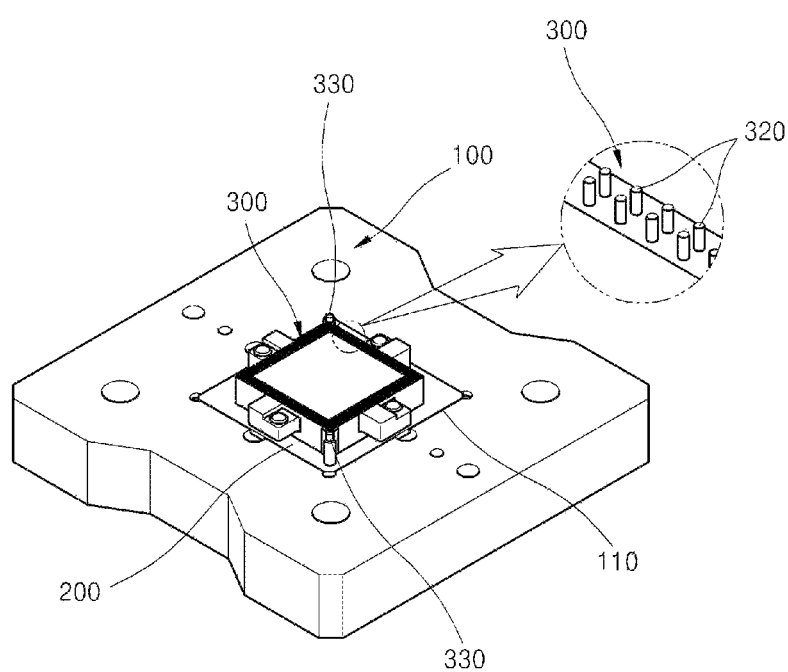
FIG. 3 is a perspective view illustrating the bottom surface of the semiconductor chip test device according to the embodiment of the present invention in a state where the components of the semiconductor chip test device are assembled.
Figure 4:
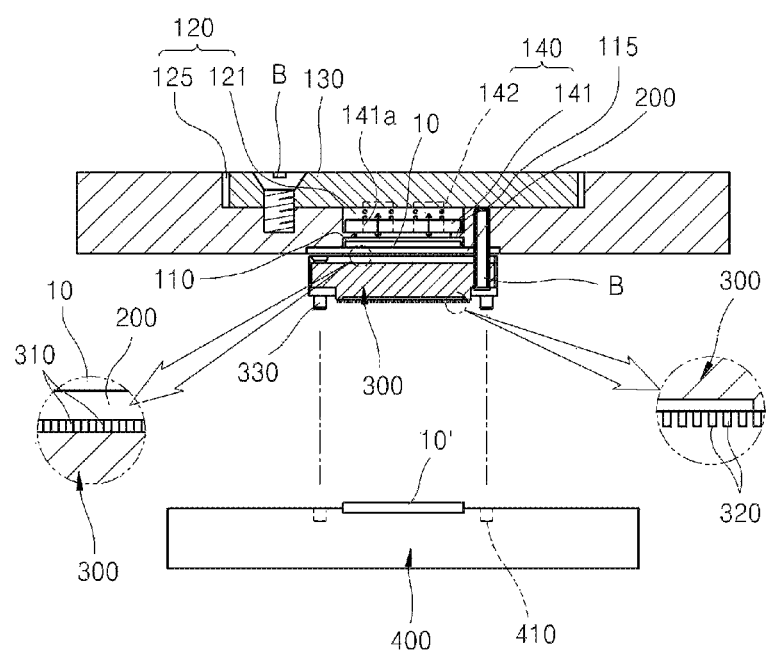
FIG. 4 is an assembled cross-sectional view illustrating a state in which the components of the semiconductor chip test device according to the embodiment of the present invention are assembled.

FIG. 3 is a perspective view illustrating the bottom surface of the semiconductor chip test device according to the embodiment of the present invention in a state where the components of the semiconductor chip test device are assembled, and FIG. 4 is an assembled cross-sectional view illustrating a state in which the components of the semiconductor chip test device according to the embodiment of the present invention are assembled.

Referring to FIGS. 1 to 4, the semiconductor chip test device according to the embodiment of the present invention includes a guide plate 100, a substrate 200, an upper socket 300, and a lower socket 400.

The guide plate 100 serves as a main body on which the semiconductor chip 10 is seated. The guide plate 100 has a concave seating groove 110 formed at the bottom thereof, such that the top of an upper semiconductor chip 10 as a test target is inserted into the seating groove 110.

The seating groove 110 may be formed in a shape corresponding to the upper semiconductor chip 10, and have the same thickness as or a similar thickness to the vertical thickness of the semiconductor chip 10.

The guide plate 100 has an opening/closing groove 120 formed through the top thereof, such that a cover 130 and a pressurizing member 130 and 140 are inserted into the opening/closing groove 120.

The opening/closing groove 120 is formed to communicate with the seating groove 110 in the vertical direction. In the present embodiment, the opening/closing groove 120 includes a first opening/closing groove 121 into which the pressurizing member 130 and 140 is inserted and a second opening/closing groove 125 into which the cover 130 is inserted.

The first opening/closing groove 121 may be formed to communicate with the seating groove 110 in the vertical direction, and have the same width as or a similar width to the seating groove 110. The pressurizing member 130 and 140 are inserted into the first opening/closing groove 121.

Between the seating groove 110 and the first opening/closing groove 121, a protrusion 115 may be formed. The protrusion 115 is formed along the inner circumferential surface of the guide plate 100 in which the seating groove 110 and the first opening/closing groove 121 are formed, and formed between the seating groove 110 and the first opening/closing groove 121 so as to distinguish between the seating groove 110 and the first opening/closing groove 121.

The upper edge part of the upper semiconductor chip 10 inserted into the seating groove 110 is locked to the bottom of the protrusion 115, and the edge part of the pressurizing member 130 and 140, or specifically a pressurizing plate 141 of a pressurizing part 140 is locked to the top of the protrusion 115.

That is, the upper semiconductor chip 10 and the pressurizing plate 141 are inserted into the seating groove 110 and the first opening/closing groove 121, respectively, with the protrusion 115 positioned therebetween, and separated at a predetermined distance from each other due to the thickness of the protrusion 115.

The second opening/closing groove 125 is formed to communicate with the first opening/closing groove 121 in the vertical direction, and has a larger width than the seating groove 110 and the first opening/closing groove 121. Between the second opening/closing groove 125 and the first opening/closing groove 121, a stepped portion is formed due to a width difference between the second opening/closing groove 125 and the first opening/closing groove 121. The edge part of the cover 130 inserted into the second opening/closing groove 125 is locked to the stepped portion.

In the opening/closing groove 120 or specifically the first opening/closing groove 121, the pressurizing member 130 and 140 is installed to elastically support the upper semiconductor chip 10 positioned in the seating groove 110 downward. The pressurizing member 130 and 140 includes a cover 130 to open/close the top of the opening/closing groove 120 and a pressurizing part 140 to elastically support the upper semiconductor chip 10.

The pressurizing part 140 serves to elastically support the upper semiconductor chip 10 downward, and includes a pressurizing part 141 and an elastic member 142.

The pressurizing plate 141 is formed in a shape corresponding to the shape of the opening/closing groove 120, and can be lifted and lowered in the opening/closing groove 120. The pressurizing plate 141 pressurizes the top of the upper semiconductor chip 10 using an elastic force provided from the elastic member 142.

In the present embodiment, the pressurizing plate 141 is inserted into the first opening/closing groove 121, and the lower surface of the pressurizing plate 141 faces the protrusion 115.

The pressurizing plate 141 pressurizes the top of the upper semiconductor chip 10 positioned in the seating groove 110 downward, and the pressurizing force of the pressurizing plate 141 is provided by the elastic force of the elastic member 142.

The pressurizing plate 141 has one or more installation grooves 141a formed therein. The installation groove 141a is formed in a concave shape from top to bottom of the pressurizing plate 141, and the elastic member 142 is inserted into the installation groove 141a.

In the present embodiment, the installation grooves 141a are formed at the center position of the pressurizing plate 141, which forms the same line as the center of the upper semiconductor chip 10, and at the edge of the pressurizing plate 141 around the center position of the pressurizing plate 141. The installation grooves 141a are formed at even intervals.

The elastic member 142 is positioned between the cover 130 and the pressurizing plate 141, and inserted into the installation grooves 141a so as to be installed on the pressurizing plate 141. In the present embodiment, a coil spring compressed or extended in the vertical direction is used as the elastic member 142.

In such a structure, the top of the elastic member 142 is supported by the bottom of the cover 130, and the bottom of the elastic member 142 is supported in the installation groove 141a by the pressurizing plate 141.

The elastic member 142 provides an elastic force of pressurizing the pressurizing plate 141 downward in a state where the top thereof is supported by the cover 130.

Through the operation of the elastic member 142, the pressurizing plate 141 is pressurized downward against the top of the upper semiconductor chip 10. The pressurizing plate 141 pressurizes the upper semiconductor chip 10 to suppress the movement of the upper semiconductor chip 10.

Thus, the upper semiconductor chip 10 may be stably fixed in the seating groove 110.

The substrate 200 is coupled to the bottom of the guide plate 110 with the upper socket 300. The upper semiconductor chip 10 as a test target is mounted on the top surface of the substrate 200. At this time, external terminals of the upper semiconductor chip 10 are electrically connected to patterns formed in the substrate 200.

The seating groove 110 has an expanded part formed at the bottom thereof, such that the top of the substrate 200 is inserted into the seating groove 110. Thus, while the installation portion of the substrate 200 is guided, the substrate 200 can be stably coupled to the bottom of the guide plate 100.

The upper socket 300 is coupled to the bottom of the guide plate 100 through a fastening member B in a state where the upper socket 300 is placed against the bottom of the substrate 200.

The upper socket 300 may have a plurality of upper pogo pins 310 protruding from the top surface thereof, and the upper pogo pins 310 may be in contact with the patterns formed at the bottom of the substrate 200.

As illustrated in FIG. 3, the upper socket 300 has a plurality of lower pogo pins 320 protruding from the bottom surface thereof, and the lower pogo pins 320 are in contact with external terminals of a lower semiconductor chip 10' which will be described below.

For this structure, the upper pogo pins 310 may be arranged at the same positions as the patterns of the substrate 200, and the lower pogo pins 320 may be arranged at the same positions as the terminals of the lower semiconductor chip 10'.

The upper pogo pins 310 and the lower pogo pins 320 are installed in such a manner that the end parts being in contact with the patterns or terminals are elastically supported by a spring installed in the pogo pins 310 and 320.

The upper pogo pings 310 and the lower pogo pins 320 can provide a buffer force to absorb an external impact, and thus buffer an impact which may occur while the semiconductor chip is tested.

According to the present embodiment, the external terminals of the upper semiconductor chip 10 are not directly inserted and connected to the upper socket 300, but the upper semiconductor chip 10 is connected to the upper socket 300 while the bottom patterns of the substrate 200 are in contact with the upper pogo pins 310 in a state where the upper semiconductor chip 10 is mounted on the substrate 200.

That is, since the upper semiconductor chip 10 is connected to the upper socket 300 through the indirect connection method using the connection between the lower patterns of the substrate 200 and the upper pogo pins 310, the upper semiconductor chip 10 and the upper socket 300 may be effectively connected to each other without a defect, regardless of whether tolerance occurred between the upper semiconductor chip 10 and the upper socket 300.

According to the above-described connection structure, when the upper semiconductor chip 10 is moved to cause an impact, the impact may be offset by the buffer force provided by the substrate 200 and the upper pogo pins 310 connected to the substrate 200.

The upper pogo pins 310 and the lower pogo pins 320 may be arranged in a plurality of lines along the edge part of the upper socket 300. The plurality of upper pogo pins 310 formed on the top surface of the upper socket 300 may be formed in the same arrangement at the positions corresponding to the plurality of lower pogo pins 320 formed on the bottom surface of the upper socket 300 in the vertical direction.

As illustrated in FIG. 4, the edge parts of the upper socket 300 and the substrate 200 may be coupled to the bottom of the guide plate 100 through the fastening member B.

The upper socket 300 may have a plurality of arrangement pins 330 formed at the bottom edge part thereof, and the arrangement pins 330 may protrude downward. In the present embodiment, the arrangement pins 330 are formed in a beam shape, and have a lower end protruding downward at a predetermined length.

The arrangement pins 330 may be inserted into insertion grooves 410 formed in the lower socket 400. The arrangement pins 330 and the insertion grooves 410 may be coupled to accurately guide the position at which the upper socket 300 is to be coupled to the lower socket 400.

As illustrated in FIGS. 1 and 4, the lower semiconductor chip 10' as a test target is seated on the top surface of the lower socket 400. At this time, the lower semiconductor chip 10' may be seated on the position at which the lower semiconductor chip 10' can be in contact with the lower pogo pins 320 of the upper socket 300.

For this structure, the lower socket 400 may have a separate seating groove formed on the top surface thereof, such that the lower semiconductor chip 10' can be seated in the seating groove.

According to the present embodiment, the lower semiconductor chip 10' may be in contact with the upper socket 300 in a state where the lower semiconductor chip 10' is seated on the top surface of the lower socket 400. The lower semiconductor chip 10' and the upper semiconductor chip 10 are seated in such a manner that the surfaces to be tested correspond to each other. Thus, both surfaces of the semiconductor chips can be tested at the same time.

Hereafter, a test process of the semiconductor chip test device according to the embodiment of the present invention will be described.

First, the upper semiconductor chip 10 mounted on the substrate 200 is inserted into the seating groove 110 of the guide plate 100.

The substrate 200 and the upper socket 300 are coupled to the bottom of the guide plate 100 through the fastening member B in a state where the upper socket 300 is placed against the bottom of the substrate 200.

At this time, the upper pogo pins 310 of the upper socket 300 are connected to the patterns formed on the bottom surface of the substrate 200 such that the upper socket 300 and the substrate 200 are electrically connected to each other.

Then, the pressurizing part 140 is inserted through the opening/closing groove 120 of the guide plate 100, and the cover 130 is coupled to the top of the opening/closing groove 120 through the fastening member B.

Thus, the pressurizing plate 141 of the pressurizing part 140 elastically supports the upper semiconductor chip 10 downward while pressurizing the upper semiconductor chip 10 using an elastic force provided from the elastic member 142.

In this state, the upper semiconductor chip 10 maintains the state in which the upper semiconductor chip 10 is placed against the upper pogo pins 310 of the upper socket 300, and the upper pogo pins 310 may absorb a part of an impact applied from the top.

When the above-described process is completed, the upper socket 300 is coupled to the lower socket 400 while the arrangement pins 330 are inserted into the insertion groove 410.

As the arrangement pins 330 and the insertion grooves 410 are coupled, the position at which the upper socket 300 is to be coupled to the lower socket 400 is accurately guided. Thus, the lower pogo pins 320 of the upper socket 300 come in contact with the external terminals of the lower semiconductor chip 10' seated on the lower socket 400.

When the upper socket 300 and the lower socket 300 are completely coupled, the upper socket 300 is electrically connected to the upper semiconductor chip 10 and the lower semiconductor chip 10'. Then, a semiconductor tester which is electrically connected to the upper socket 300 can be used to perform a performance test on both surfaces of the semiconductor chip.

At this time, since the upper semiconductor chip 10 is connected to the upper socket 300 through the indirect connection method using the connection between the lower patterns of the substrate 200 and the upper pogo pins 310, the upper semiconductor chip 10 and the upper socket 300 can be effectively connected to each other without a defect, regardless of whether tolerance occurred between the upper semiconductor chip 10 and the upper socket 300.

According to the above-described connection structure, when the upper semiconductor chip 10 is moved to cause an impact, the impact may be offset by the buffer force provided by the substrate 200 and the upper pogo pins 310 connected to the substrate 200.

The semiconductor chip test device according to the embodiment of the present invention can suppress the occurrence of connection defect between the upper semiconductor chip 10 and the upper socket 300, and absorb an impact which may occur during a performance test of the semiconductor chip, thereby preventing the damage of the device and the semiconductor chip. Thus, the test yield of the semiconductor chip can be stably maintained.

While various embodiments have been described above, it will be understood to those skilled in the art that the embodiments described are by way of example only. Accordingly, the disclosure described herein should not be limited based on the described embodiments.

The invention claimed is:

1. A semiconductor chip test device comprising:
   a guide plate having a seating groove formed at the bottom thereof;
   a substrate coupled to the bottom of the guide plate, and having an upper semiconductor chip mounted on the top surface thereof such that the upper semiconductor chip is positioned in the seating groove;
   an upper socket coupled to the bottom of the substrate, and having
      upper pogo pins formed on the top surface thereof and contacted with bottom patterns of the substrate, and lower pogo pins formed on the bottom surface thereof, wherein the upper pogo pins protrude upward, and the lower pogo pins protrude downward; and
   a lower socket having a lower semiconductor chip seated on the top surface thereof, the lower semiconductor chip being in contact with the lower pogo pins,
   wherein the guide plate has an opening/closing groove formed at the top thereof, the opening/closing groove communicating with the seating groove while being formed through the guide plate in the vertical direction, and a pressurizing member is installed in the opening/closing groove so as to elastically support the upper semiconductor chip positioned in the seating groove downward.

2. The semiconductor chip test device of claim 1, wherein the pressurizing member comprises:
   a cover coupled to the opening/closing groove; and
   a pressurizing part positioned between the cover and the upper semiconductor chip, and electrically supporting the upper semiconductor chip downward.

3. The semiconductor chip test device of claim 2, wherein the pressurizing part comprises:
   a pressurizing plate installed between the cover and the upper semiconductor chip so as to be lifted and lowered, and pressurizing the upper semiconductor chip downward; and
   an elastic member installed between the cover and the pressurizing plate and providing an elastic force of pressurizing the pressurizing plate downward.

4. The semiconductor chip test device of claim 3, wherein the pressurizing plate comprises a plurality of installation grooves formed at the center position thereof, which forms the same line as the center of the upper semiconductor chip, and at the edge part around the center position thereof, the installation grooves being formed at even intervals along the edge part.

5. The semiconductor chip test device of claim 1, further comprising a fastening member coupling the upper socket and the substrate to the bottom of the guide plate through edge parts of the upper socket and the substrate.

6. The semiconductor chip test device of claim 1, wherein the upper pogo pins and the lower pogo pins are arranged in a plurality of lines along the top and bottom edges of the upper socket.

7. The semiconductor chip test device of claim 1, wherein the upper socket has a plurality of arrangement pins formed at the bottom edge thereof so as to protrude downward, and the lower socket has a plurality of concave insertion grooves formed on the top surface thereof, such that the arrangement pins are inserted into the insertion grooves.

\* \* \* \* \*